(12) United States Patent
Hou et al.

(10) Patent No.: US 10,545,270 B2
(45) Date of Patent: Jan. 28, 2020

(54) METHOD OF MANUFACTURING NANO METAL GRATING AND NANO METAL GRATING MANUFACTURED THEREBY

(71) Applicant: SHENZHEN CHINA STAR OPTOELECTRONICS TECHNOLOGY CO., LTD., Shenzhen (CN)

(72) Inventors: Jun Hou, Shenzhen (CN); Macai Lu, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 121 days.

(21) Appl. No.: 15/576,862

(22) PCT Filed: Nov. 8, 2017

(86) PCT No.: PCT/CN2017/109831
§ 371 (c)(1),
(2) Date: Nov. 27, 2017

(87) PCT Pub. No.: WO2019/037281
PCT Pub. Date: Feb. 28, 2019

(65) Prior Publication Data
US 2019/0064406 A1 Feb. 28, 2019

(30) Foreign Application Priority Data

Aug. 25, 2017 (CN) .......................... 2017 1 0739576

(51) Int. Cl.
*G02B 5/18* (2006.01)
*G03F 7/00* (2006.01)

(52) U.S. Cl.
CPC ......... *G02B 5/1852* (2013.01); *G02B 5/1809* (2013.01); *G03F 7/0002* (2013.01)

(58) Field of Classification Search
CPC .. G02B 5/1852; G02B 5/1809; G02B 5/3058; G02B 5/1857; G02B 5/1861;
(Continued)

(56) References Cited

U.S. PATENT DOCUMENTS 9,239,413 B2    1/2016  Zhu et al.
2012/0224246 A1  9/2012  Yeh
2018/0088265 A1* 3/2018  Kim ................. G02F 1/133617

FOREIGN PATENT DOCUMENTS

CN           2235147 Y    9/1996
CN         103149615 A    6/2013
(Continued)

*Primary Examiner* — Collin X Beatty
(74) *Attorney, Agent, or Firm* — JMB Davis Ben-David

(57) ABSTRACT

A method of manufacturing a nano metal grating is provided. In the method, a patterned metal oxide film is formed on a surface of the metal layer through the formation of metal oxides in an oxygen ashing process, and the nano metal grating is manufactured by using the patterned metal oxide film as a mask. Thus, a drawback that the metal layer cannot be etched after the metal layer is oxidized is solved, and the metal oxide film is not only used as a mask to manufacture the nano metal grating, but the metal oxide film is also used as a protective layer of the nano metal grating.

9 Claims, 5 Drawing Sheets

(58) Field of Classification Search
CPC .... G02B 5/1866; G02B 5/1847; G02B 5/008;
G02B 2207/101; G02B 2006/12107;
G02B 2006/12173; G02B 2006/12176;
G03F 7/0002; G03F 7/00; G03F 7/0005;
G03F 7/0017; G03F 7/0035; B82Y 40/00
USPC .......... 359/569, 566, 572, 485.05, 563, 575;
216/24, 2, 67; 438/32, 699, 709
See application file for complete search history.

(56) References Cited

FOREIGN PATENT DOCUMENTS

| | | |
|---|---|---|
| CN | 104459854 A | 3/2015 |
| CN | 104503012 A | 4/2015 |

\* cited by examiner

METHOD OF MANUFACTURING NANO METAL GRATING AND NANO METAL GRATING MANUFACTURED THEREBY

CROSS-REFERENCE TO RELATED APPLICATIONS

This is the U.S. National Stage of International Patent Application No. PCT/CN2017/109831, filed Nov. 8, 2017, which in turn claims the benefit of Chinese Patent Application No. 201710739576.3, filed Aug. 25, 2017.

FIELD OF INVENTION

This disclosure relates to display technology, and more particularly to a method of manufacturing a nano metal grating and the nano metal grating manufactured by the method.

BACKGROUND OF INVENTION

A nano metal grating can pass incident light which is identical to an electric field direction perpendicular to a grating direction, and can reflect light which is identical to the electric field direction parallel to the grating direction. Based on this principle of operation, reflected light can be reused by adding an anti-reflection film or similar. Therefore, penetrating ability of the nano metal grating as a polarizer of a display for the incident light penetration is far greater than that of a traditional polarizer. Transmission rate of the nano metal grating as the polarizer of the display is up to 90%, and contrast ratio of the nano metal grating as the polarizer of the display is up to 10,000:1. That can greatly improve a LCD transmittance and contrast to meet market requirements of high penetration and high contrast.

Nano-imprint technology provides a stamp with nano-scale patterns and is used to imprint the nano-scale patterns on an imprint resin to obtain nano patterns through a thermo compression method or a UV curing method. The nano-imprint technology has high resolution, low cost, high yield and many other advantages since its inception in 1995 and has evolved into a variety of imprint technology. Currently, the nano-imprint technology mainly includes hot embossing, UV embossing, and micro-contact printing. A conventional nano-imprint process consists of four main steps: film forming, imprinting, mold stripping and pattern transferring. After mold stripping, it is usually necessary to remove a residual adhesive layer by means of reactive ion etching or the like, and the pattern transferring requires use of etching or stripping technology to convert a pattern into a pattern of desired material.

Currently, the nano-imprint technology is widely used to manufacture nano-metal grating. FIGS. 1A-1F are flow-charts of the conventional nano-imprint technology for manufacturing the nano-metal grating.

Referring to FIG. 1A, a substrate 10 is provided. A metal layer 11 is disposed on the substrate 10, and an imprinting adhesive layer 12 is coated on the metal layer 11.

Referring to FIG. 1B, the imprinting adhesive layer 12 that has not been cured is imprinted with an imprinting template 13, and a periodic pattern of the imprinting template 13 is transferred onto the imprinting adhesive layer 12.

Referring to FIG. 1C, the imprinting adhesive layer 12 is heated or UV treatment so that the imprinting adhesive layer 12 is cured. After curing, the imprinting template 13 is removed to form a patterned imprinted adhesive 14.

Referring to FIG. 1D, since the imprinting template 13 has a limited depth and imprinting glue materials have certain fluidity, there is there will be imprint glue remaining at a bottom of the pattern inevitably. Therefore, the remaining imprint glue must be removed before etching a metal. In this step, the remaining imprint glue is removed by an oxygen ashing method for exposing a bottom of the metal layer 11.

Referring to FIG. 1E, the metal layer 11 exposed at the bottom of the pattern is etched. A pattern of the patterned imprinted adhesive 14 is transferred onto the metal layer 11.

Referring to FIG. 1F, the patterned imprinted adhesive 14 is removed to form a patterned metal layer 15. That is, a nano-metal grating is formed.

Disadvantages of the method for manufacturing the nano-metal grating are as follows. Since the imprinting template 13 has a limited depth and imprinting glue materials have certain fluidity, there is there will be imprint glue remaining at a bottom of the pattern inevitably. Therefore, the remaining imprint glue must be removed before a metal being etched. Generally, the oxygen ashing method is used to remove the remaining imprint glue. However, this method is difficult to ensure that the remaining imprint glue is removed completely. If a processing time of the method is slightly longer or an airflow control is not accurate, oxygen will react with Al exposed on the bottom to form a dense metal oxide film, which leads to a subsequent etching cannot be performed.

SUMMARY OF INVENTION

The disclosure provides a method of manufacturing a nano metal grating and the nano metal grating manufactured by the method for solving drawbacks that an etching step cannot be performed after a metal layer is oxidized.

In order to solve the above-mentioned drawbacks, the disclosure provides a method of manufacturing a nano metal grating, which comprises steps of: providing a substrate formed with a metal layer thereon, wherein the metal layer is made of aluminum; forming a to-be-imprinted resin layer on the metal layer; providing an imprinting template having a grating cycle pattern for imprinting the to-be-imprinted resin layer, wherein the grating cycle pattern includes periodic grating grooves; curing the to-be-imprinted resin layer, removing the imprinting template after curing the to-be-imprinted resin layer, to form an imprinted resin having the grating cycle pattern, and to leave an imprinted resin residue on a bottom of the grating cycle pattern of the imprinted resin; performing an oxygen ashing process to remove the imprinted resin residue on the bottom of the grating cycle pattern, to expose the metal layer under the bottom of the grating cycle pattern, so that the exposed metal layer is reacted with an oxygen to form a metal oxide film; removing the imprinted resin having the grating cycle pattern; and using the metal oxide film as a mask to pattern the metal layer, to form the nano metal grating.

This disclosure further provides a method of manufacturing a nano metal grating, which comprises steps of: providing a substrate formed with a metal layer thereon; forming an to-be-imprinted resin layer on the metal layer; providing an imprinting template having a grating cycle pattern for imprinting the to-be-imprinted resin layer; curing the to-be-imprinted resin layer, removing the imprinting template after curing the to-be-imprinted resin layer, to form an imprinted resin having the grating cycle pattern, and to leave an imprinted resin residue on a bottom of the grating cycle pattern of the imprinted resin; performing an oxygen ashing process to remove the imprinted resin residue on the bottom of the grating cycle pattern, to expose the metal layer under the bottom of the grating cycle pattern, so that a metal oxide film is formed on a surface of the exposed metal layer; removing the imprinted resin having the grating cycle pattern; and using the metal oxide film as a mask to pattern the metal layer, to form the nano metal grating.

In one embodiment, the substrate is made of one of glass, quartz, PET, silicon, sapphire or indium tin oxide.

In one embodiment, the grating cycle pattern includes periodic grating grooves

In one embodiment, in the step of providing an imprinting template having a grating cycle pattern for imprinting the to-be-imprinted resin layer, the imprinted resin of the to-be-imprinted resin layer is filled with the periodic grating groove of the imprinting template.

In one embodiment, a method of curing the to-be-imprinted resin layer is to heat the to-be-imprinted resin layer.

In one embodiment, a method of curing the to-be-imprinted resin layer is to irradiate the to-be-imprinted resin layer with ultraviolet light.

In one embodiment, the metal layer is made of aluminum.

In one embodiment, in the step of performing an oxygen ashing process to remove the imprinted resin residue on the bottom of the grating cycle pattern to expose the metal layer under the bottom of the grating cycle pattern so that a metal oxide film is formed on a surface of the exposed metal layer, the exposed metal layer is reacted with an oxygen to form the metal oxide film.

This disclosure further provides a nano metal grating manufactured by the method described above. The nano metal grating comprising a recess and a convex portion, an upper end of the convex portion is formed with a metal oxide film.

In one embodiment, the nano metal grating is made of aluminum, and the metal oxide film is an alumina film.

Advantages of the disclosure are as follows. A patterned metal oxide film is formed on a surface of the metal layer through metal oxides are formed in an oxygen ashing process, so that the metal oxides are not readily etched. The nano metal grating is manufactured by using the patterned metal oxide film as a mask. Thus, a drawback in a conventional technology that the metal layer cannot be etched after the metal layer is oxidized is solved, and the metal oxide film is not only used as a mask to manufacture the nano metal grating, but the metal oxide film is also used as a protective layer of the nano metal grating without affecting its optical properties.

DETAILED DESCRIPTION OF PREFERRED EMBODIMENTS

The preferred embodiments adopted by this disclosure are given in the following detailed description, with reference to the drawings.

As mentioned in the background of the invention, after the remaining imprint glue is removed by the oxygen ashing method, If a processing time of the method is slightly longer or an airflow control is not accurate, oxygen will react with Al exposed on the bottom to form a dense metal oxide film. The metal oxide film is difficult to be etched, which leads to a subsequent etching step cannot be performed and is unable to form a nano-metal grating. In view of this, this disclosure provides a method of manufacturing a nano metal grating. During a step of removing remaining imprinted glue, a process time is increased so that oxygen reacts with the exposed metal to form a dense oxide film, and the oxide film is used as a barrier layer for subsequent metal etching step to form a nano-metal grating.

Figure 1A:
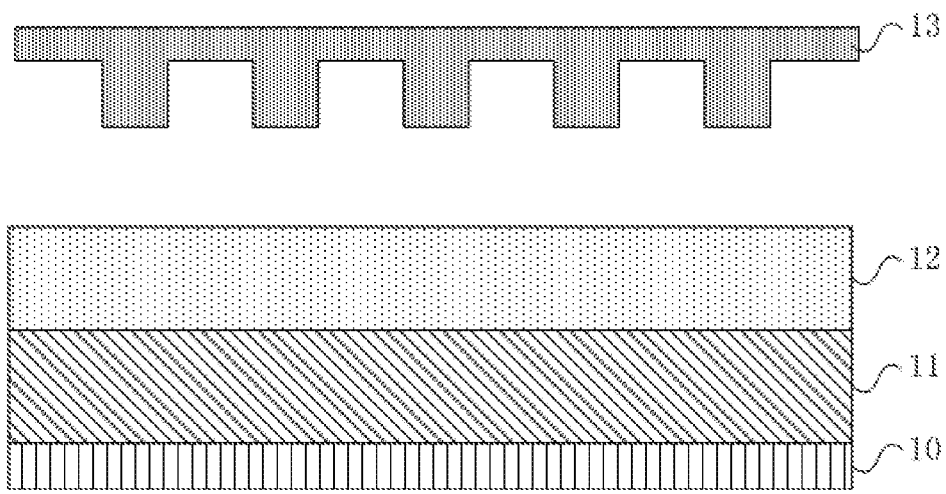
FIGS. 1A-1F are flowcharts of a conventional nano-imprint technology for manufacturing the nano-metal grating.
Figure 1B:
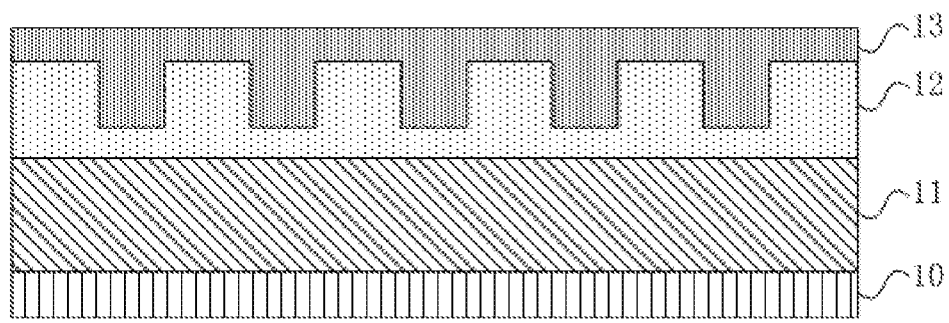
Figure 1C:
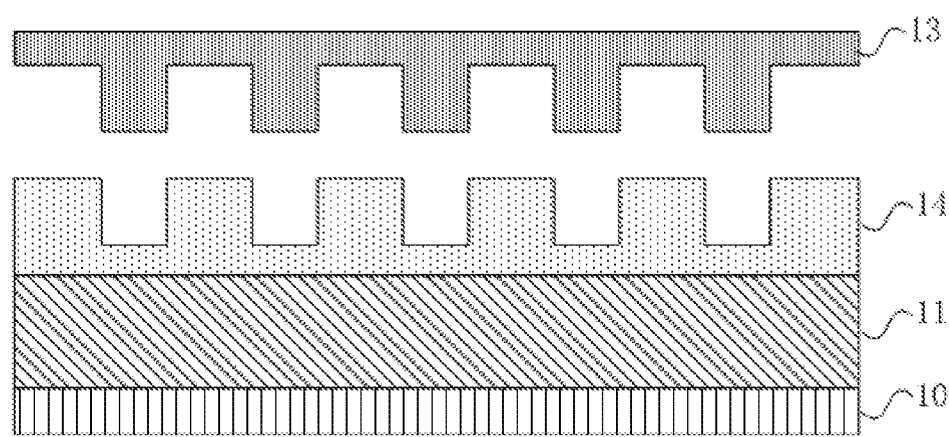
Figure 1D:
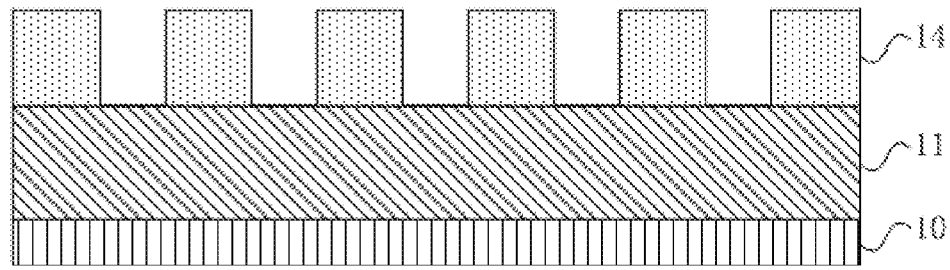
Figure 1E:
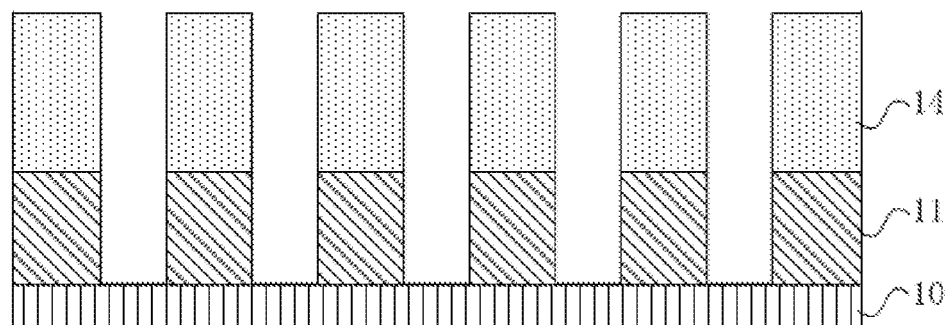
Figure 1F:
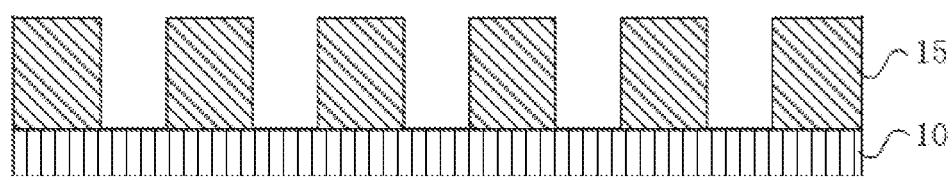
Figure 2:
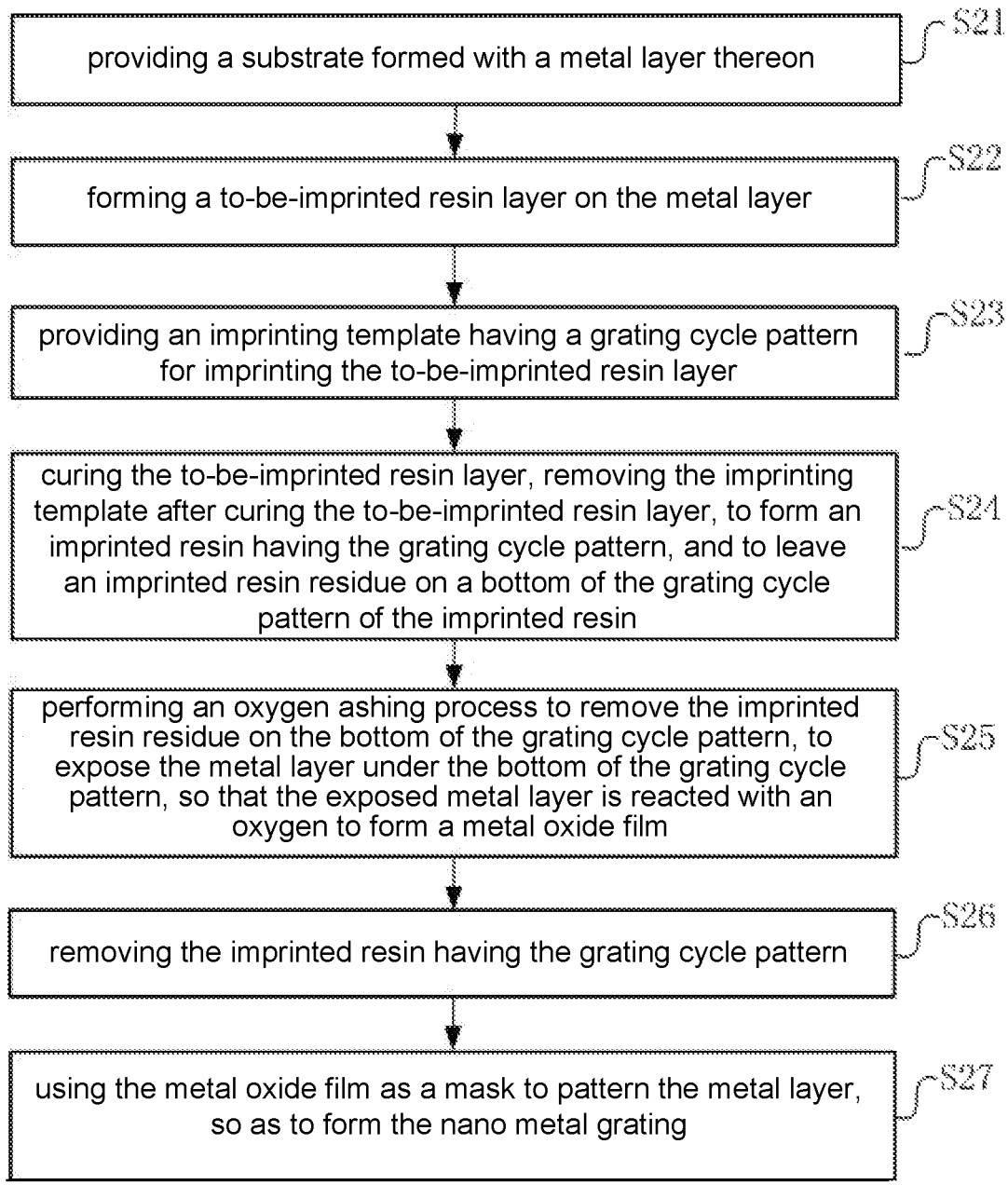
FIG. 2 is a step schematic of a method of manufacturing a nano metal grating according to this disclosure.

FIG. 2 is a step schematic of a method of manufacturing a nano metal grating according to this disclosure. FIGS. 3A-3G are flowcharts of the method of manufacturing a nano metal grating according to this disclosure. Referring to FIG. 2, the disclosure provides a method of manufacturing a nano metal grating, which comprises steps of: in a step S21, providing a substrate formed with a metal layer thereon; in a step S22, forming a to-be-imprinted resin layer on the metal layer; in a step S23, providing an imprinting template having a grating cycle pattern for imprinting the to-be-imprinted resin layer; in a step S24, curing the to-be-imprinted resin layer, removing the imprinting template after curing the to-be-imprinted resin layer, to form an imprinted resin having the grating cycle pattern, and to leave an imprinted resin residue on a bottom of the grating cycle pattern of the imprinted resin; in a step S25, performing an oxygen ashing process to remove the imprinted resin residue on the bottom of the grating cycle pattern, to expose the metal layer under the bottom of the grating cycle pattern, so that the exposed metal layer is reacted with an oxygen to form a metal oxide film; in a step S26, removing the imprinted resin having the grating cycle pattern; and in a step S27, using the metal oxide film as a mask to pattern the metal layer, to form the nano metal grating.

Figure 3A:
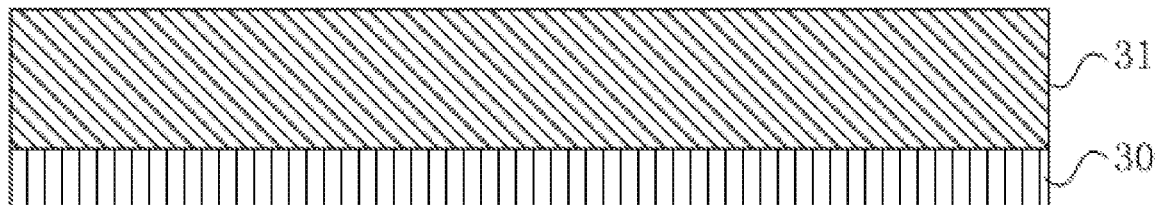
FIGS. 3A-3G are flowcharts of the method of manufacturing a nano metal grating according to this disclosure.

Referring to FIG. 3A and the step S21, a substrate 30 is provided and a metal layer 31 is formed on the substrate 30. A material of the substrate 30 includes but is not limited to one of glass, quartz, PET, silicon, sapphire or indium tin oxide, which has a high transmittance to light. The metal layer 31 is made of aluminum. In this step, the metal layer 31 can be formed by a conventional method in this field on a surface of the substrate 30. For example, a magnetron sputtering method or an electron beams evaporation method.

Figure 3B:
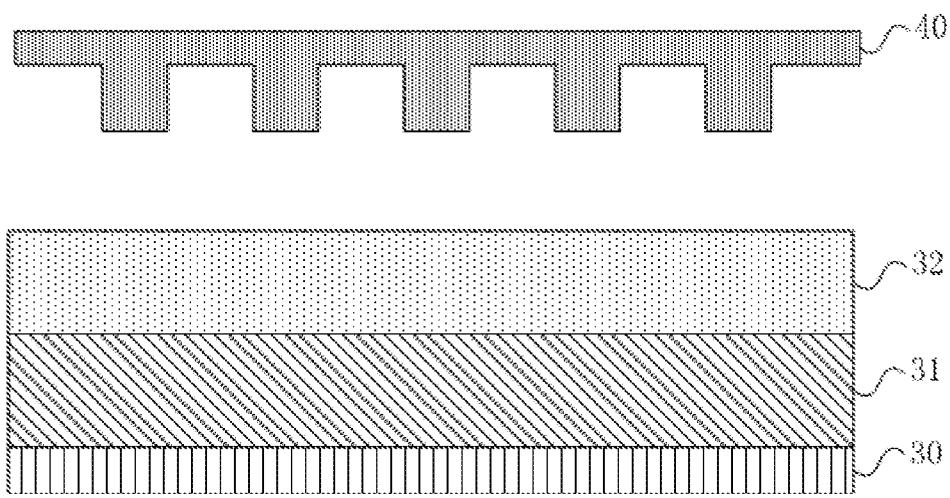

Referring to FIG. 3B and the step S22, a to-be-imprinted resin layer 32 is formed on the metal layer 31. The to-be-imprinted resin layer 32 includes but not limited to polymethylmethacrylate, dimethylsiloxane, or SU8 resin. For example, in an embodiment, a composition of the to-be-imprinted resin layer 32 comprises a hyperbranched oligomer, PMMA (polymethylmethacrylate), and an organic diluent. A specific step of forming the to-be-imprinted resin layer 32 on the metal layer 31 is as follows. The to-be-imprinted resin layer 32 is spin-coated on a surface of the metal layer 31. A unglued speed is selected at 4000 rpm for 1 minute, and then the to-be-imprinted resin layer 32 is heated at a temperature of 80° C. for 3 minutes to obtain the to-be-imprinted resin layer 32 having a certain thickness. Meanwhile, referring to FIG. 3B, an imprinting template 40 having a grating cycle pattern can also be provided. The grating cycle pattern includes periodic grating grooves. Shape of the grating grooves is rectangular or circular and a depth depends on a height of a desired pattern.

Figure 3C:
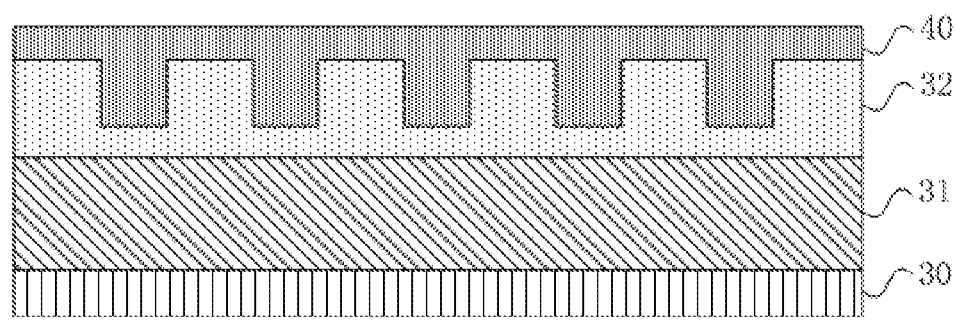

Referring to FIG. 3C and the step S23, an imprinting template 40 having a grating cycle pattern is provided for imprinting the to-be-imprinted resin layer 32. The imprinted resin of the to-be-imprinted resin layer 32 is filled with the periodic grating groove of the imprinting template 40. In this step, a certain pressure is applied to a surface of the imprinting template 40 for a certain period of time to imprint the to-be-imprinted resin layer 32. For example, an imprinting machine can be used to achieve imprinting. The grating cycle pattern on a surface of the imprinting template 40 is replicated to the to-be-imprinted resin layer 32, and a recess and a convex portion of the to-be-imprinted resin layer 32 correspond to a recess and a convex portion of the imprinting template 40, respectively.

Figure 3D:
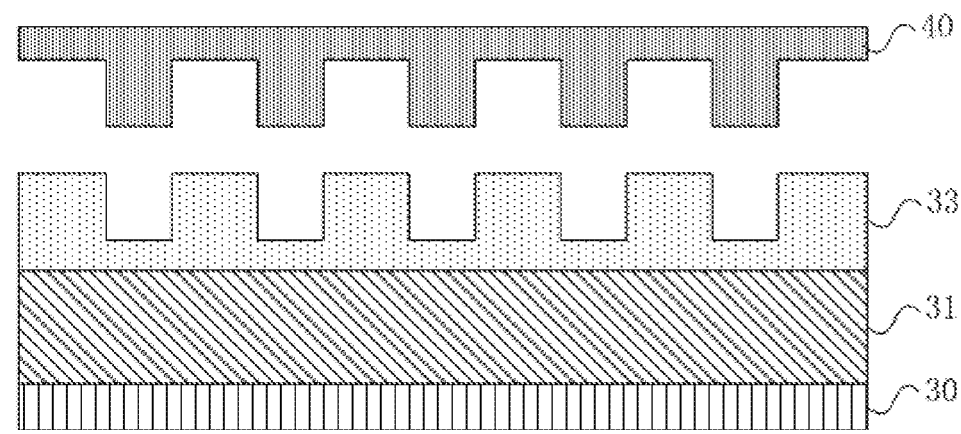

Referring to FIG. 3D and the step S24, the to-be-imprinted resin layer 32 is cured. The imprinting template 40 is removed after curing the to-be-imprinted resin layer 32, so as to form an imprinted resin 33 having the grating cycle pattern. An imprinted resin residue remains on a bottom of the grating cycle pattern of the imprinted resin. In this step, a method of curing the to-be-imprinted resin layer 32 is to heat the to-be-imprinted resin layer 32 or to irradiate the to-be-imprinted resin layer 32 with ultraviolet light. Since a depth of the imprinting template 40 is limited and imprinting resin materials have certain fluidity, the imprinted resin residue remains on a bottom of the grating cycle pattern of the imprinted resin.

Figure 3E:
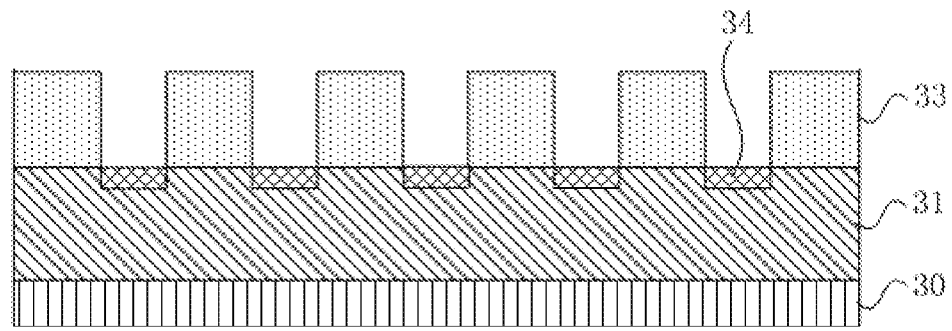

Referring to FIG. 3E and the step S25, an oxygen ashing process is performed to remove the imprinted resin residue on the bottom of the grating cycle pattern, and to expose the metal layer 31 under the bottom of the grating cycle pattern, so that the exposed metal layer 31 is reacted with an oxygen to form a metal oxide film 34. Besides, when the oxygen ashing process is performed to remove the imprinted resin residue and the exposed metal layer 31 is oxidized, the imprinted resin of the to-be-imprinted resin layer 32 also reacts. However, the to-be-imprinted resin layer 32 is thicker and is not completely removed. In this step, the metal layer 31 is made of aluminum. Aluminum reacts with oxygen to form a dense alumina film. After this step, the metal layer corresponding to the recess of the to-be-imprinted resin layer 32 is oxidized to form the metal oxide film 34.

Figure 3F:
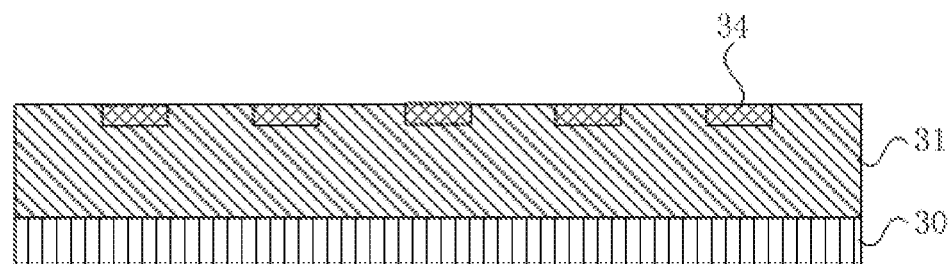

Referring to FIG. 3F and the step S26, the imprinted resin 33 having the grating cycle pattern is removed. A method of removing the imprinted resin 33 can be cleaning with a washing solution. After this step, a surface of the metal layer 31 has a patterned metal oxide film 34 whose position corresponds to a position of a convex portion of the nanometal grating formed subsequently.

Figure 3G:
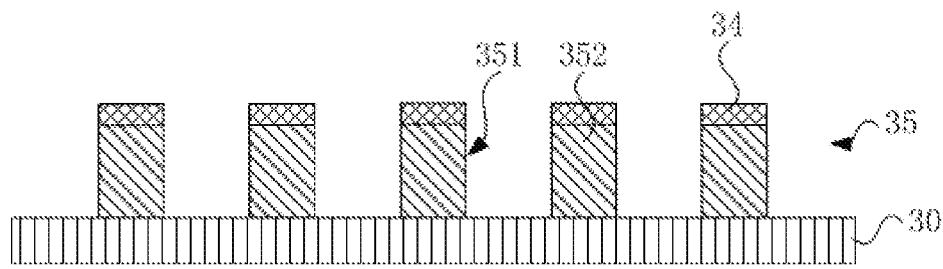

Referring to FIG. 3G and the step S27, the metal oxide film 34 is used as a mask to pattern the metal layer 31, so as to form the nano metal grating 35. A method for patterning the metal layer 31 is a dry etching process. In the dry etching process, since the metal oxide film 34 is not etched, it serves as an etching mask. In a region absence of the metal oxide film 34, the metal layer 31 is etched to form a recess 351 of the nano metal grating 35. A region with the metal oxide film 34 forms the convex portion 352 of the nano metal grating 35. Moreover, in this step, the metal layer at the recess 351 is completely removed and the substrate 30 is exposed.

This disclosure provides a method of manufacturing a nano metal grating. A patterned metal oxide film is formed on a surface of the metal layer through metal oxides are formed in an oxygen ashing process, so that the metal oxides are not readily etched. The nano metal grating is manufactured by using the patterned metal oxide film as a mask. Thus, a drawback in a conventional technology that the metal layer cannot be etched after the metal layer is oxidized is solved, and the metal oxide film is not only used as a mask to manufacture the nano metal grating, but the metal oxide film is also used as a protective layer of the nano metal grating without affecting its optical properties.

Figure 4:
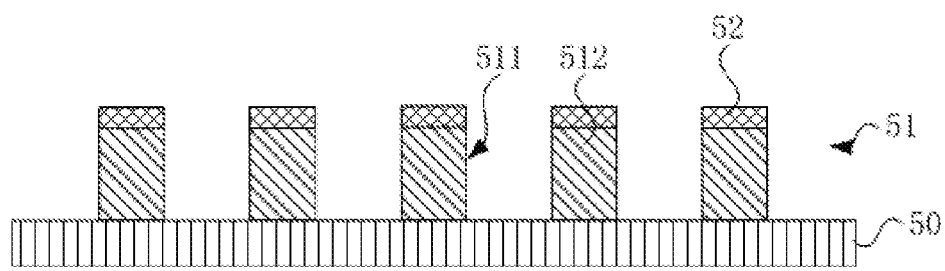
FIG. 4 is a structural schematic view of the nano metal grating according to this disclosure.

FIG. 4 is a structural schematic view of the nano metal grating according to this disclosure. Referring to FIG. 4, the nano metal grating 51 is disposed on a substrate 50. A material of the substrate 50 includes but is not limited to one of glass, quartz, PET, silicon, sapphire or indium tin oxide, which has a high transmittance to light. The nano metal grating 51 comprises a recess 511 and a convex portion 512. An upper end of the convex portion 512 is formed with a metal oxide film 52. The metal oxide film 52 is used as a protective layer of the nano metal grating 51 without affecting its optical characteristics. A material of the metal oxide film 52 is an oxide of a material of the nano metal grating 51. For example, the material of the nano metal grating 51 is aluminum, and the material of the metal oxide film 52 is aluminum oxide.

This disclosure has been described with preferred embodiments thereof, and it is understood that many changes and modifications to the described embodiment can be carried out without departing from the scope and the spirit of the invention.

What is claimed is:

1. A method of manufacturing a nano metal grating, comprising steps of:
   providing a substrate formed with a metal layer thereon, wherein the metal layer is made of aluminum;
   forming a to-be-imprinted resin layer on the metal layer;
   providing an imprinting template having a grating cycle pattern for imprinting the to-be-imprinted resin layer, wherein the grating cycle pattern includes periodic grating grooves;
   curing the to-be-imprinted resin layer, removing the imprinting template after curing the to-be-imprinted resin layer, to form an imprinted resin having the grating cycle pattern, and to leave an imprinted resin residue on a bottom of the grating cycle pattern of the imprinted resin;
   performing an oxygen ashing process to remove the imprinted resin residue on the bottom of the grating cycle pattern, to expose the metal layer under the bottom of the grating cycle pattern, so that the exposed metal layer reacts with oxygen to form a metal oxide film;
   removing the imprinted resin having the grating cycle pattern; and
   using the metal oxide film as a mask to pattern the metal layer, to form the nano metal grating.

2. A method of manufacturing a nano metal grating, comprising steps of:
   providing a substrate formed with a metal layer thereon;
   forming an to-be-imprinted resin layer on the metal layer;
   providing an imprinting template having a grating cycle pattern for imprinting the to-be-imprinted resin layer;
   curing the to-be-imprinted resin layer, removing the imprinting template after curing the to-be-imprinted resin layer, to form an imprinted resin having the grating cycle pattern, and to leave an imprinted resin residue on a bottom of the grating cycle pattern of the imprinted resin;
   performing an oxygen ashing process to remove the imprinted resin residue on the bottom of the grating cycle pattern, to expose the metal layer under the bottom of the grating cycle pattern, so that a metal oxide film is formed on a surface of the exposed metal layer;

removing the imprinted resin having the grating cycle pattern; and using the metal oxide film as a mask to pattern the metal layer, to form the nano metal grating.

3. The method of manufacturing the nano metal grating according to claim 2, wherein the substrate is made of one of glass, quartz, PET, silicon, sapphire or indium tin oxide.

4. The method of manufacturing the nano metal grating according to claim 2, wherein the grating cycle pattern includes periodic grating grooves.

5. The method of manufacturing the nano metal grating according to claim 4, wherein in the step of providing an imprinting template having a grating cycle pattern for imprinting the to-be-imprinted resin layer, the imprinted resin of the to-be-imprinted resin layer is filled with the periodic grating groove of the imprinting template.

6. The method of manufacturing the nano metal grating according to claim 2, wherein a method of curing the to-be-imprinted resin layer is to heat the to-be-imprinted resin layer.

7. The method of manufacturing the nano metal grating according to claim 2, wherein a method of curing the to-be-imprinted resin layer is to irradiate the to-be-imprinted resin layer with ultraviolet light.

8. The method of manufacturing the nano metal grating according to claim 2, wherein the metal layer is made of aluminum.

9. The method of manufacturing the nano metal grating according to claim 2, wherein in the step of performing an oxygen ashing process to remove the imprinted resin residue on the bottom of the grating cycle pattern to expose the metal layer under the bottom of the grating cycle pattern so that a metal oxide film is formed on a surface of the exposed metal layer, the exposed metal layer is reacted with an oxygen to form the metal oxide film.

* * * * *